(12) United States Patent
Bandholz et al.

(10) Patent No.: US 9,646,947 B2
(45) Date of Patent: May 9, 2017

(54) INTEGRATED CIRCUIT WITH INDUCTIVE BOND WIRES

(75) Inventors: Justin P. Bandholz, Raleigh, NC (US); Pravin Patel, Raleigh, NC (US); Peter R. Seidel, Cary, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1660 days.

(21) Appl. No.: 12/644,704

(22) Filed: Dec. 22, 2009

(65) Prior Publication Data
US 2011/0148543 A1 Jun. 23, 2011

(51) Int. Cl.
*H01L 23/00* (2006.01)
*H01L 23/64* (2006.01)
(Continued)

(52) U.S. Cl.
CPC ............. *H01L 24/48* (2013.01); *H01L 22/20* (2013.01); *H01L 23/645* (2013.01); *H01L 25/0657* (2013.01); *H01L 25/50* (2013.01); *H01L 22/14* (2013.01); *H01L 24/45* (2013.01); *H01L 24/73* (2013.01); *H01L 24/85* (2013.01); *H01L 2223/6611* (2013.01); *H01L 2224/32145* (2013.01); *H01L 2224/32225* (2013.01); *H01L 2224/45015* (2013.01); *H01L 2224/45124* (2013.01); *H01L 2224/45144* (2013.01); *H01L 2224/45147* (2013.01); *H01L 2224/4809* (2013.01); *H01L 2224/4847* (2013.01); *H01L 2224/48092* (2013.01); *H01L 2224/48227* (2013.01); *H01L 2224/48599* (2013.01);
(Continued)

(58) Field of Classification Search
CPC ....... H01L 24/48; H01L 24/49; H01L 23/645; Y10T 29/49071; Y10T 29/49147
USPC .................... 29/605, 842; 333/193
See application file for complete search history.

(56) References Cited

U.S. PATENT DOCUMENTS 4,131,516 A 12/1978 Bakos et al.
4,733,461 A 3/1988 Nakano
(Continued)

FOREIGN PATENT DOCUMENTS

EP 0 213 205 A1 11/1987
EP 1 202 296 A1 2/2002
(Continued)

OTHER PUBLICATIONS

Gary Breed, "Analyzing Signals Using the Eye Diagram", Nov. 2005, High Frequency Electronics, vol. 4 No. 11, pp. 50, 52, 53.*
(Continued)

*Primary Examiner* — Livius R Cazan
(74) *Attorney, Agent, or Firm* — Brandon C. Kennedy; Douglas W. Robinson; Kennedy Lenart Spraggins LLP

(57) ABSTRACT

An integrated circuit (IC) that includes a semiconductor die in an IC package. The semiconductor die includes an electrical endpoint. The IC also includes a pad affixed to the semiconductor die. The pad is characterized by a capacitance and is coupled to the electrical endpoint. The IC also includes a bond wire coupling the pad to an IC package pin. The bond wire is an inductor characterized by an inductance. The inductance is configured to decrease signal degradation caused by the capacitance of the pad on electrical signals transmitted between the pin and the electrical endpoint of the semiconductor die.

5 Claims, 4 Drawing Sheets

(51) Int. Cl.
  *H01L 25/065* (2006.01)
  *H01L 21/66* (2006.01)
  *H01L 25/00* (2006.01)

(52) U.S. Cl.
  CPC ......... *H01L 2224/48699* (2013.01); *H01L 2224/73265* (2013.01); *H01L 2224/85207* (2013.01); *H01L 2225/0651* (2013.01); *H01L 2225/06527* (2013.01); *H01L 2924/014* (2013.01); *H01L 2924/01013* (2013.01); *H01L 2924/01014* (2013.01); *H01L 2924/01029* (2013.01); *H01L 2924/01033* (2013.01); *H01L 2924/01047* (2013.01); *H01L 2924/01079* (2013.01); *H01L 2924/14* (2013.01); *H01L 2924/15311* (2013.01); *H01L 2924/19041* (2013.01); *H01L 2924/2076* (2013.01); *H01L 2924/20751* (2013.01); *H01L 2924/30107* (2013.01)

(56) References Cited

U.S. PATENT DOCUMENTS

| | | | |
|---|---|---|---|
| 5,298,686 | A | 3/1994 | Bourdelaise et al. |
| 5,452,178 | A | 9/1995 | Emesh et al. |
| 5,839,184 | A * | 11/1998 | Ho et al. .................. 29/605 |
| 5,963,464 | A | 10/1999 | Dell et al. |
| 5,967,799 | A | 10/1999 | Arai |
| 5,998,259 | A | 12/1999 | Chuang |
| 6,194,774 | B1 | 2/2001 | Cheon |
| 6,197,181 | B1 | 3/2001 | Chen |
| 6,208,225 | B1 * | 3/2001 | Miller ......................... 333/202 |
| 6,290,833 | B1 | 9/2001 | Chen |
| 6,300,578 | B1 | 10/2001 | Hoffmeyer et al. |
| 6,404,001 | B2 | 6/2002 | Koo et al. |
| 6,512,285 | B1 | 1/2003 | Hashemi et al. |
| 6,541,712 | B1 | 4/2003 | Gately et al. |
| 6,621,012 | B2 | 9/2003 | Crockett et al. |
| 6,638,410 | B2 | 10/2003 | Chen et al. |
| 6,646,520 | B2 | 11/2003 | Miller |
| 6,653,170 | B1 | 11/2003 | Lin |
| 6,678,145 | B2 | 1/2004 | Naito et al. |
| 6,680,659 | B2 | 1/2004 | Miller |
| 6,717,071 | B2 | 4/2004 | Chang et al. |
| 6,775,901 | B1 | 8/2004 | Lee et al. |
| 6,803,665 | B1 | 10/2004 | Megahed et al. |
| 6,822,529 | B2 | 11/2004 | Miller |
| 6,853,003 | B2 | 2/2005 | Lee |
| 6,913,471 | B2 | 7/2005 | Smith |
| 6,927,481 | B2 | 8/2005 | Gibson et al. |
| 6,958,547 | B2 | 10/2005 | Dubin et al. |
| 6,983,535 | B2 | 1/2006 | Crockett et al. |
| 7,005,721 | B2 | 2/2006 | Nishijima |
| 7,030,712 | B2 | 4/2006 | Brunette et al. |
| 7,118,985 | B2 | 10/2006 | Allman et al. |
| 7,123,497 | B2 | 10/2006 | Matsui et al. |
| 7,154,356 | B2 | 12/2006 | Brunette et al. |
| 7,186,919 | B2 | 3/2007 | Kim et al. |
| 7,204,648 | B2 | 4/2007 | Aronson |
| 7,227,240 | B2 | 6/2007 | Knapp et al. |
| 7,249,337 | B2 | 7/2007 | Gisin et al. |
| 7,277,005 | B2 | 10/2007 | Kang et al. |
| 7,342,300 | B2 | 3/2008 | Wight et al. |
| 7,916,511 | B2 | 3/2011 | Park |
| 8,064,222 | B2 | 11/2011 | Nishio et al. |
| 2002/0191366 | A1 | 12/2002 | Naito et al. |
| 2002/0195271 | A1 | 12/2002 | Gailus |
| 2003/0137042 | A1 | 7/2003 | Mess et al. |
| 2004/0232559 | A1 | 11/2004 | Adelmann |
| 2005/0010725 | A1 | 1/2005 | Eilert |
| 2005/0062556 | A1 | 3/2005 | Aronson |
| 2005/0082664 | A1 | 4/2005 | Funaba et al. |
| 2005/0178669 | A1 | 8/2005 | Strubbe |
| 2005/0184825 | A1 | 8/2005 | Oran |
| 2005/0233501 | A1 | 10/2005 | Nose et al. |
| 2006/0113677 | A1 * | 6/2006 | Kuroda ............... H01L 23/3128 257/777 |
| 2007/0096332 | A1 | 5/2007 | Satoh et al. |
| 2007/0103251 | A1 | 5/2007 | Fan et al. |
| 2007/0117348 | A1 | 5/2007 | Ramanathan et al. |
| 2008/0054428 | A1 | 3/2008 | Lam |
| 2009/0049414 | A1 | 2/2009 | Mutnury et al. |
| 2010/0124035 | A1 | 5/2010 | Bandholz et al. |
| 2011/0073359 | A1 | 3/2011 | Cases et al. |
| 2011/0108972 | A1 | 5/2011 | Foster et al. |
| 2011/0109381 | A1 | 5/2011 | Foster, Sr. et al. |
| 2011/0110064 | A1 | 5/2011 | Foster, Sr. et al. |
| 2011/0110065 | A1 | 5/2011 | Foster, Sr. et al. |
| 2011/0148543 | A1 | 6/2011 | Bandholz et al. |
| 2011/0312129 | A1 | 12/2011 | Joseph et al. |

FOREIGN PATENT DOCUMENTS

| | | | |
|---|---|---|---|
| JP | 6140451 | A | 5/1994 |
| JP | 2000031651 | A | 1/2000 |
| JP | 2008028188 | | 2/2008 |
| KR | 20030084355 | | 11/2003 |
| WO | PCT/JP85/00704 | | 11/1987 |
| WO | WO 2004/025695 | A2 | 3/2004 |

OTHER PUBLICATIONS

Integrated circuit (IC) (electronics), Britannica Online Encyclopedia, accessed Oct. 21, 2013, http://www.britannica.com/EBchecked/topic/289645/integrated-circuit-IC/.*
Annonymous; Method for a Cylindrical Chip Capacitor; IP.com Prior Art Database Technical Disclosure; Mar. 16, 2005; IP.com.
Office Action, U.S. Appl. No. 12/274,407, May 24, 2011.
Breed, "Analyzing Signals Using the Eye Diagram", Nov. 2005, High Frequency Electronics, vol. 4 No. 11, pp. 50, 52, 53.
Office Action, U.S. Appl. No. 12/616,563, Aug. 6, 2012.
Office Action, U.S. Appl. No. 12/644,704, Aug. 31, 2012.
Office Action, U.S. Appl. No. 12/617,169, Feb. 17, 2012, pp. 1-18.
Notice of Allowance, U.S. Appl. No. 12/617,169, Apr. 27, 2012, pp. 1-07.
Office Action, U.S. Appl. No. 12/274,407, May 24, 2011, pp. 1-09.
Notice of Allowance, U.S. Appl. No. 12/274,407, Sep. 29, 2011, pp. 1-12.
Office Action, U.S. Appl. No. 12/570,029, Oct. 20, 2011, pp. 1-09.
Office Action, U.S. Appl. No. 12/570,029, Dec. 15, 2011, pp. 1-11.
Notice of Allowance, U.S. Appl. No. 12/570,029, Apr. 6, 2012, pp. 1-08.
Office Action, U.S. Appl. No. 12/616,912, Feb. 3, 2012, pp. 1-10.
Office Action, U.S. Appl. No. 12/616,912, May 31, 2012, pp. 1-06.
Notice of Allowance, U.S. Appl. No. 12/616,912, Jul. 10, 2012, pp. 1-11.
Office Action, U.S. Appl. No. 12/617,273, Feb. 3, 2012, pp. 1-10.
Office Action, U.S. Appl. No. 12/617,273, May 31, 2012, pp. 1-07.
Notice of Allowance, U.S. Appl. No. 12/617,273, Jul. 9, 2012, pp. 1-10.
Office Action, U.S. Appl. No. 12/644,704, Apr. 3, 2012, pp. 1-06.

* cited by examiner

Endpoint 402

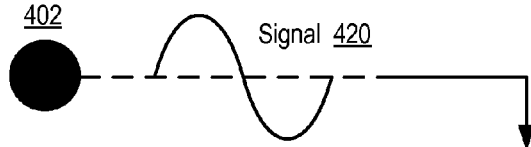

Signal 420

Transmit A Signal Between An Electrical Endpoint Of The IC And An IC Package Pin, The Transmitted Signal Experiencing A Reduced Amount Of Signal Degradation In The IC, The IC Including: A Semiconductor Die In An IC Package, The Semiconductor Die Comprising The Electrical Endpoint; A Pad Affixed To The Semiconductor Die, The Pad Characterized By A Capacitance, The Pad Coupled To The Electrical Endpoint; A Bond Wire Coupling The Pad To The IC Package Pin, The Bond Wire Including An Inductor Characterized By An Inductance, The Inductance Configured To Decrease Degradation Of The Transmitted Signal Caused By The Capacitance Of The Pad On Electrical Signals Transmitted Between The Pin And The Electrical Endpoint Of The Semiconductor Die 404

Transmit A Signal Where The Bond Wire Includes Inductive Metal Added To A Base Bond Metal Of The Bond Wire
406

Transmit A Signal Where The Bond Wire Includes A Plurality Of Loops Of The Bond Wire
408

Transmit A Signal Where The Inductance Of The Bond Wire Is Determined In Dependence Upon The Capacitance Of The Pad, An Average Frequency Of Electrical Signals To Be Transmitted Between The Pin And The Electrical Endpoint Of The Semiconductor Die, Electrical Characteristics Of The IC Package, And Electrical Characteristics Of The Pin 410

Transmit A Signal Where The IC Is A Dual Die, Double Data Rate Three ('DDR3'), Two Dual Inline Memory Modules ('DIMMs') Per Channel, Quad Rank, Synchronous Dynamic Random Access Memory ('SDRAM') DIMM 412

Transmit A Signal Where The Where The Reduced Amount Of Signal Degradation Is A Reduced Amount Of Signal Jitter 414

Transmit A Signal Where The Where The Reduced Amount Of Signal Degradation Is A Reduced Amount Of Signal Reflection 416

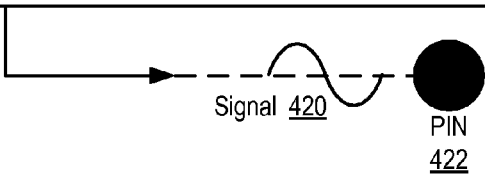

Signal 420

PIN 422

FIG. 4

INTEGRATED CIRCUIT WITH INDUCTIVE BOND WIRES

BACKGROUND OF THE INVENTION

Field of the Invention

The field of the invention is data processing, or, more specifically, integrated circuits with inductive bond wires, methods of manufacturing such integrated circuits, and method of transmitting electrical signals in such integrated circuits.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Computer systems today are made up of a number of integrated circuits. Computer processors, computer memory, bus adapters, and the like are implemented as integrated circuits. As clock speeds increase, timing errors have increased. In particular, dual in-line memory modules (DIMMs) have strict timing requirements for operation. Many DIMMs, however, encounter timing errors due to signal degradation, such as jitter and reflection, caused by internal components of the integrated circuit. For example, DIMMs typically include a pad connecting an electrical circuit fabricated on a semiconductor die to a bond wire which in turn is connected to a pin on the DIMM. The pad acts as a capacitor in the circuit. The capacitance of the pad typically introduces signal jitter and signal reflection to signals transmitted in the IC. As mentioned before, such jitter and reflection degrades signal quality to a point where timing errors in the DIMM may occur.

SUMMARY OF THE INVENTION

Integrated circuits ('ICs') with inductive bond wires, methods of manufacturing ICs with inductive bond wires, and methods of transmitting signals in ICs having inductive bond wires are disclosed. An IC having an inductive bond wire in accordance with present invention includes a semiconductor die in an IC package. The semiconductor die includes an electrical endpoint. The IC also includes a pad affixed to the semiconductor die. The pad is characterized by a capacitance and is coupled to the electrical endpoint. The IC also includes a bond wire coupling the pad to an IC package pin. The bond wire is an inductor characterized by an inductance. The inductance is configured to decrease signal degradation caused by the capacitance of the pad on electrical signals transmitted between the pin and the electrical endpoint of the semiconductor die.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 4 sets forth an exemplary method of transmitting an electrical signal in an IC having inductive bond wires in accordance with embodiments of the present invention.

DETAILED DESCRIPTION OF EXEMPLARY EMBODIMENTS

Exemplary integrated circuits with inductive bond wires, methods of manufacturing such integrated circuits, and method of transmitting electrical signals in such integrated circuits in accordance with the present invention are described with reference to the accompanying drawings, beginning with FIG. 1A and with FIG. 1B.

Figure 1A:
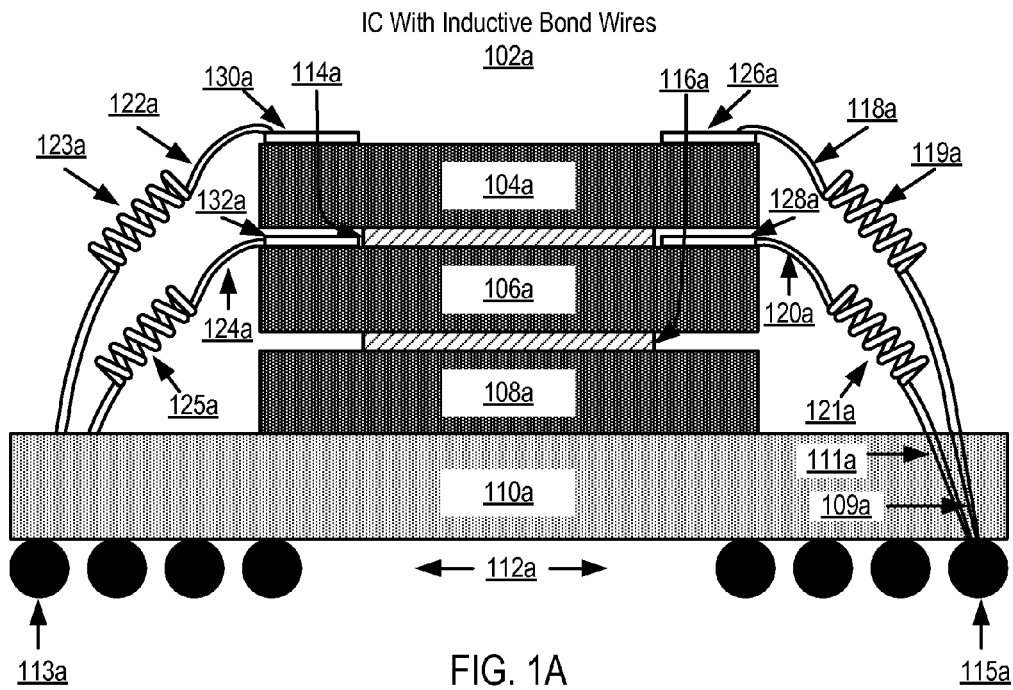
FIG. 1A sets forth a line drawing of an integrated circuit ('IC') with inductive bond wires formed of bond wire loops in accordance with embodiments of the present invention.
Figure 1B:
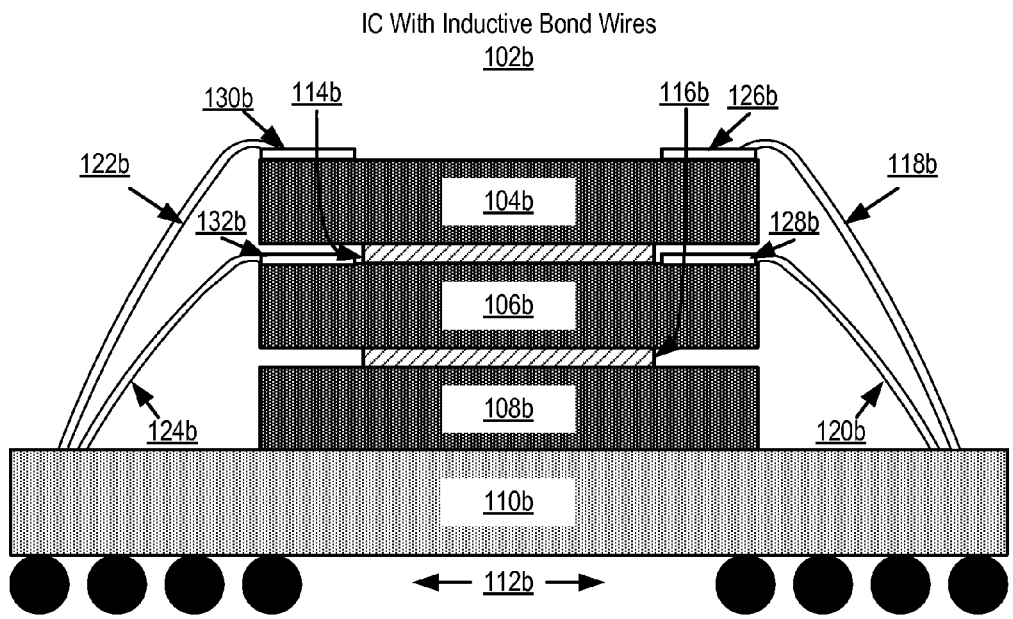
FIG. 1B sets forth a line drawing of an integrated circuit ('IC') with inductive bond wires formed of inductive metal added to a base bond metal of the bond wire in accordance with embodiments of the present invention.

Each of FIGS. 1A and 1B depicts an example integrated circuit ('IC') with inductive bond wires according to embodiments of the present invention. The IC (102a) of FIG. 1A depicts an example IC with inductive bond wires including a number of loops. The IC (102b) of FIG. 1B depicts an example IC with inductive bond wires including inductive metal added to a base bond metal of the bond wire.

In FIG. 1A, the IC (102a) includes three semiconductor dies (104a, 106a, 108a) in an IC package (110a). A semiconductor die is a small block of semiconducting material, on which a particular functional circuit is fabricated. In some embodiments, integrated circuits are produced in large batches on a single wafer of electronic-grade silicon (EGS) through processes such as photolithography. The wafer is cut, or 'diced,' into many pieces, each containing one copy of the circuit. Each of these pieces is called a die. The semiconductor dies (104a) of FIG. 1A may be implemented as memory modules and the IC (102a) may be a dual in-line memory module (DIMM). More specifically, the IC (102a) may be implemented as a Double Data Rate Three (DDR3), quad rank, dual die, two DIMMs per channel, SDRAM ('Synchronous Dynamic Random Access Memory') DIMM. An IC configured with inductive bond wires in accordance with embodiments of the present invention may also implement, for example, other DIMM types, computer processors, a memory controller, a northbridge or southbridge of a mother board chipset, an I/O ('input/output') bus adapter, and so on as will occur to readers of skill in the art.

In the example of FIG. 1A, the semiconductor dies include two electrical endpoints (114a, 116a). An electrical endpoint as the term is used in this specification is an electrical conductor that electrically couples the circuit fabricated on the semiconductor die to a bond wire through a pad.

The example IC (102a) of FIG. 1A includes a number of pads (126a, 128a, 130a, 132a) affixed to the semiconductor dies and coupled to the electrical endpoints (114a, 116a). A pad is a contact point that couples a bond wire to an electrical endpoint on a semiconductor die. Wire bonding is a method of making interconnections between an integrated circuit ('IC') and a printed circuit board ('PCB') during semiconductor device fabrication. Wire bonding may also be employed to connect an IC to other electronics or to connect from one PCB to another. Wire bonding is generally considered the most cost-effective and flexible interconnect technology and is used to assemble the vast majority of semiconductor packages. Diameters of bond wires start at 15 micrometers and may range to several hundred micrometers for high-powered applications. A bond wire may be composed of a base bond metal, such as Gold, Aluminum, or Copper.

There are two main types of wire bonding: ball bonding and wedge bonding. Ball bonding typically includes gold and copper wire and usually requires heat. Wedge bonding can use either gold or aluminum wire, with the gold wire requiring heat. In either type of wire bonding, the wire is attached at both ends using some combination of heat, pressure, and ultrasonic energy to make a weld to a pad.

In the example of FIG. 1A, each of the pads (126a, 128a, 130a, 132a) is characterized by a capacitance. That is, each of the pads, due to its intrinsic electrical characteristics, effectively acts as a capacitor in the integrated circuit. The capacitance of the pad in an IC of the prior typically degrades signals transmitted within the IC. In fact, in ICs of the prior art, the capacitance causes signal degradation such as signal reflection and introduces signal jitter. Such signal reflection and signal jitter creates significant timing errors, such as setup and hold time errors, when such a prior art IC is a DIMM, such as a DDR3, quad rank, dual die, two DIMM per channel, DIMM.

The example IC (102a) of FIG. 1A also includes four bond wires (118a, 120a, 122a, 124a), with each bond wire coupling a pad (126a, 128a, 130a, 132a) to one of the IC package pins (112a). Specifically, bond wire (118a) and (120a) couple pad (126a) and (128a), respectively, to pin (115a) through package components (109a) and (111a). Bond wire (122a) and bond wire (124a) couple pad (130a) and pad (132a), respectively, to pin (113a) through package components within the IC package (110a). An IC package pin is a conductor that couples electronics inside the IC package to traces on a PCB. In the example of FIG. 1A, the pins (112a) of the IC (102a) are depicted as a ball grid array for clarity only, not limitation. Readers of skill in the art will immediately recognize that other types of pin configurations may be implemented in ICs configured with inductive bond wires according to embodiments of the present invention.

Each of the bond wires (118a, 120a, 122a, 124a) of the example IC (102a) of FIG. 1 is an inductor characterized by an inductance. An inductor is a passive electrical component that can store energy in a magnetic field created by the electric current passing through it. An inductor's ability to store magnetic energy is measured by its inductance, in units of henries. The inductance of the bond wires (118a, 120a, 122a, 124a) is configured to decrease signal degradation caused by the capacitance of the pads (126a, 128a, 130a, 132a) on electrical signals transmitted between a pin (112a) and an electrical endpoint (114a, 116a). The inductive bond wires of FIG. 1A decrease signal degradation by counteracting or neutralizing the effect of the pad capacitance. In the example of FIG. 1A, the bond wires (118a, 120a, 122a, 124a) are configured with a number of loops (119a, 121a, 123a, 125a). An inductor may be formed by shaping a conducting wire as a coil, the loops creating a magnetic field inside the coil in accordance with Faraday's Law of Induction. The inductance of the bond wire is varied with the number of loops of the bond wire—the greater the number loops, the higher the inductance of the bond wire and vice versa. In the example of FIG. 1A, the inductance of the bond wires (118a, 120a, 122a, 124a) may be determined in dependence upon the capacitance of the pads, an average frequency of electrical signals to be transmitted between the pins (112a) and the electrical endpoints (114a, 116a) of the semiconductor dies (104a, 106a), the electrical characteristics of the IC package (110a), and the electrical characteristics of the pins (112a).

The electrical characteristics of the IC package (110a) are the electrical characteristics of the package components (109a, 111a) in the example IC (102a) of FIG. 1A. Package components (109a, 111a) as the term is used in this specification refers to the components within the IC package that couples a pin (115a) outside the package to a bond wire (118a, 120a) inside the package.

An IC configured with inductive bond wires in accordance with embodiments of the present invention, may implement various circuit types. An IC with inductive bond wires in accordance with embodiments of the present invention may, for example, implement a Dual Data Rate Three ('DDR3'), Dual Inline Memory Module ('DIMM'). More specifically, the IC (102a) of FIG. 1 may implement a dual die, DDR3, two DIMMs per channel, quad rank, SDRAM ('Synchronous Dynamic Random Access Memory')

Turning now to FIG. 1B, the IC (102b) is similar to the example IC (102a) of FIG. 1A, with similar parts having similar reference numerals. IC (102b), for example, is configured with three semiconductor dies (104b, 106b, 108b) in an IC package (110b). Each semiconductor die includes an electrical endpoint (114b, 116b). A number of pads (126b, 128b, 130b, 132b) are affixed to the semiconductor dies and are coupled to the electrical endpoints (114b, 116b). Each of the pads (126b, 128b, 130b, 132b) is characterized by a capacitance. The IC (102b) of FIG. 1B also includes four bond wires (118b, 120b, 122b, 124b), with each bond wire coupling a pad (126b, 128b, 130b, 132b) to an IC package pin (112b).

The example IC (102b) of FIG. 1B differs from the example IC (102a) of FIG. 1A in that the inductive bond wires of the IC (102b) are configured with an inductive metal that is added to a base bond metal of the bond wire. An inductive metal as the term is used in this specification refers to any metal that when added to a base bond wire metal varies the inductance of the bond wire. Examples of an inductive metal, base bond metal pair include, iron and copper, iron and silver, iron and gold, and so on as will occur to readers of skill in the art. An inductive metal may be 'added' to a base bond metal in various ways including for example, by creating an alloy of the base bond and inductive metals, by coating the base bond metal with the inductive metal, and in other ways as will occur to readers of skill in the art.

Figure 2:
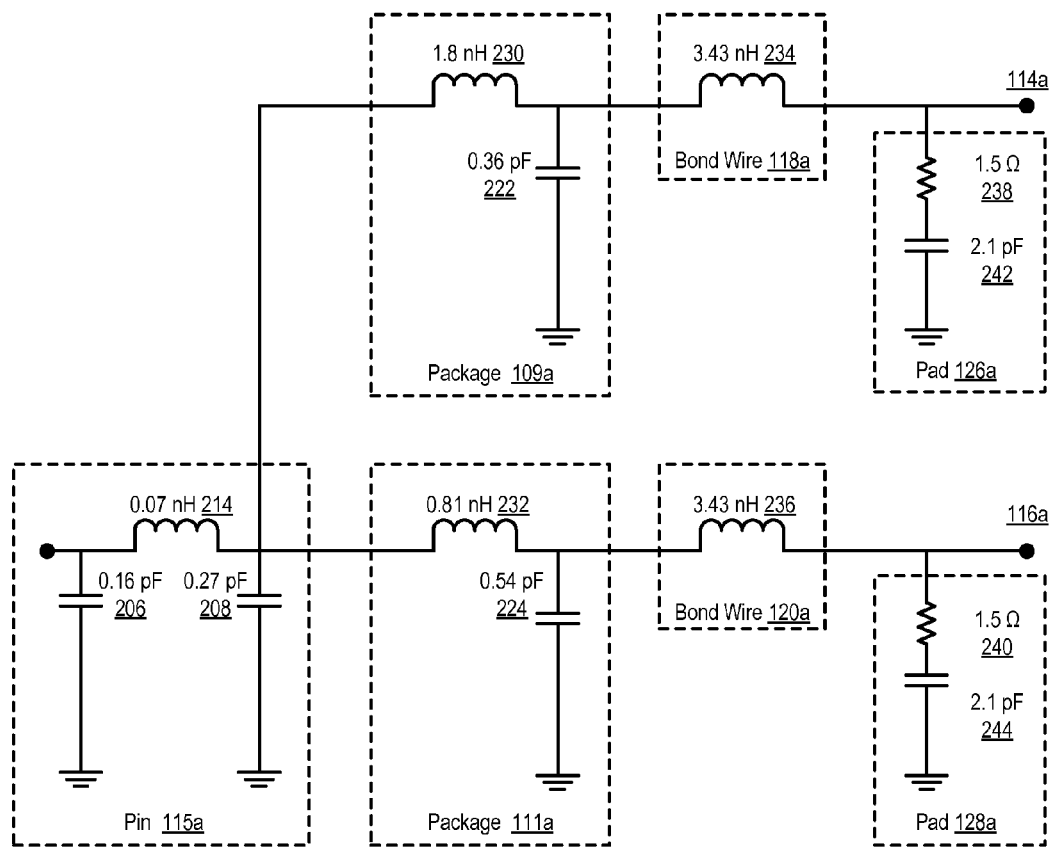
FIG. 2 sets forth an electrical schematic of an IC having inductive bond wires according to embodiments of the present invention.

For further explanation, FIG. 2 sets forth an electrical schematic of an IC having inductive bond wires according to embodiments of the present invention. The components of schematic of FIG. 2 correspond to components of the IC (102a) of FIG. 1A and will be described here with reference to the IC (102a) of FIG. 1A. More specifically, FIG. 2 depicts a schematic of the electrical characteristics of one pin (115a) that is electrically coupled to the electrical endpoint (114a) through package components (109a), a bond wire (118a), a pad (126a), and to the electrical endpoint (116a) through package components (111a), bond wire (120a), and pad (128a).

The electrical characteristics of the pin (112a) include two capacitors (206,208) and an inductor (214). Capacitor (206) is 0.16 pico farads (pF) and the capacitor (208) is 0.27 pF. The inductor is 0.07 nano Henries (nH). The pin (115a) is coupled to package components (109a). The electrical characteristics of the package components (109a) are represented as a 1.87 nH inductor (230) and a 0.36 pF capacitor (222). The package components (109a) are coupled to the bond wire (118a). The bond wire (118a) in the example of FIG. 2 is an inductor (234) having an inductance of 3.43 nH. The bond wire (118a) is coupled to a pad (126a). The electrical characteristics of the pad (126a) include a 1.5 ohm resistor (238) and a 2.1 pF capacitor (242). The 2.1 pF capacitance in ICs that are not configured with inductive bond wires in accordance with embodiments of the present invention, typically introduces signal degradation, such as signal jitter or signal reflection, into electrical signals carried to and from the electrical endpoint (114a) and the pin (115a). To counteract such signal degradation, the bond wire (118a) is configured as an inductor (234). In some embodiments the inductance of the inductor is selected, calculated, or otherwise determined, in dependence upon the capacitance of the pad, an average frequency of electrical signals to be transmitted between the pin and the electrical endpoint, the electrical characteristics of the IC package, and the electrical characteristics of the pin.

In the example of FIG. 2, the pin (115a) is also coupled to package components (111a). The electrical characteristics of the package components (111a) are represented as a 0.81 nH inductor (232) and a 0.54 pF capacitor (224). The package components (111a) are coupled to the bond wire (120a). The bond wire (120a) in the example of FIG. 2 is an inductor (236) having an inductance of 3.43 nH. The bond wire (120a) is coupled to a pad (128a). The electrical characteristics of the pad (128a) include a 1.5 ohm resistor (240) and a 2.1 pF capacitor (244). The inductance (236) of the bond wire (120a) in the example of FIG. 1 has been selected as 3.43 nH —the same inductance as (234) as the bond wire (118a). Although each of the bond wires in this example is characterized by the same inductance, 3.43 nH, such is for clarity of explanation, not for limitation. In fact, each bond wire may be configured with different inductance independence upon the capacitance of the pad, an average frequency of electrical signals to be transmitted between the pin and the electrical endpoint, the electrical characteristics of the IC package, and the electrical characteristics of the pin.

Figure 3:
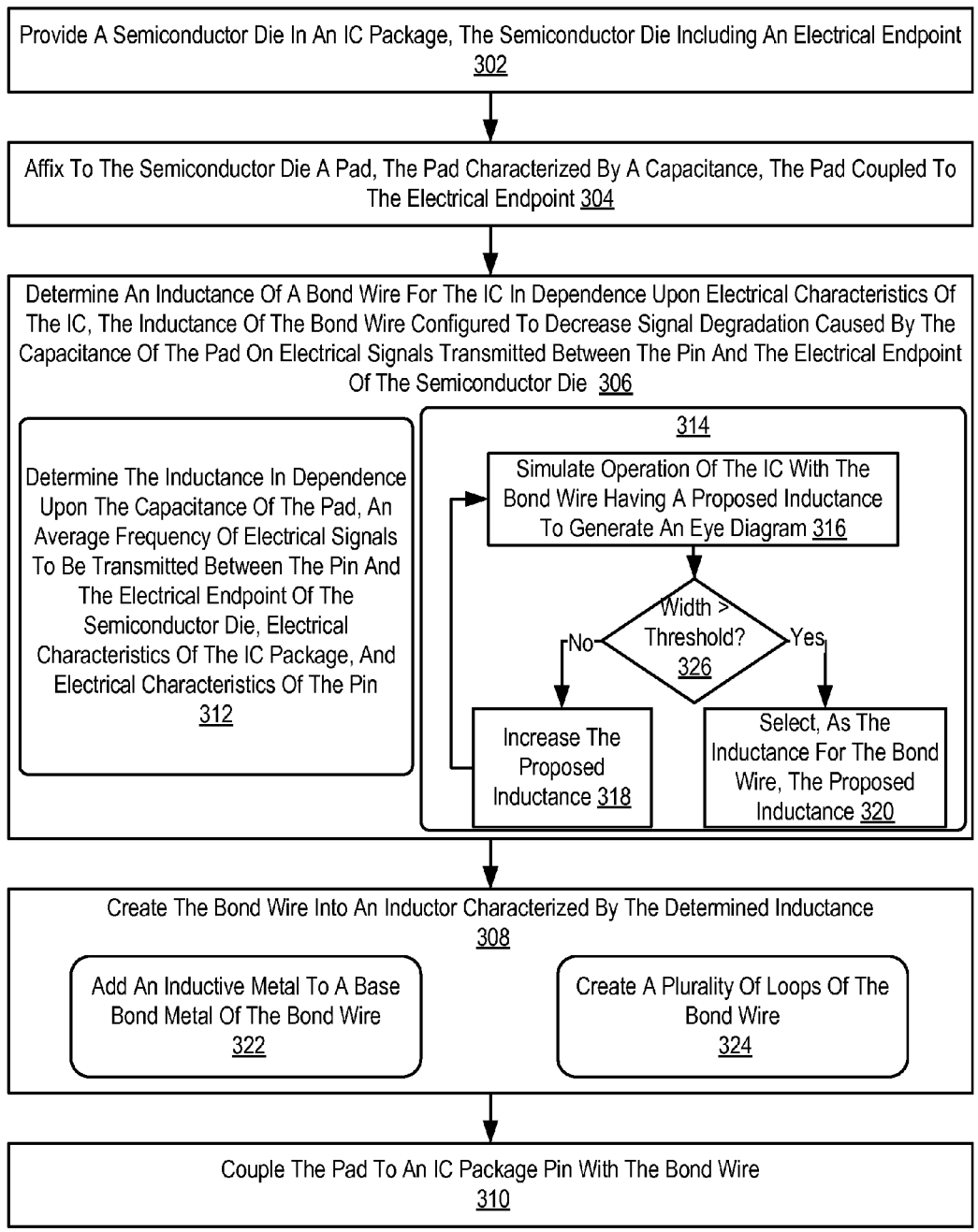
FIG. 3 sets forth an exemplary method of manufacturing an IC with inductive bond wires in accordance with embodiments of the present invention.

For further explanation, FIG. 3 sets forth an exemplary method of manufacturing an IC with inductive bond wires in accordance with embodiments of the present invention. In the method of FIG. 3, the IC may be implemented as a dual die, DDR3, two DIMMs per channel, quad rank, SDRAM DIMM.

The method of FIG. 3 includes providing (302) a semiconductor die in an IC package. In the example of FIG. 3, the semiconductor die includes an electrical endpoint. Providing (302) a semiconductor die in an IC package may be carried out by fabricating an electrical circuit on the semiconductor die and affixing the semiconductor die within an IC package. Providing (302) a semiconductor die in an IC package may also include coupling IC package pins to internal package components for later connection to bond wires.

The method of FIG. 3 also includes affixing (304) to the semiconductor die a pad. In the method of FIG. 3, the pad is characterized by a capacitance and is coupled to the electrical endpoint. Affixing (304) a pad to the semiconductor die may be carried out in various ways including, for example, applying an adhesive to the pad, bonding the pad to the semiconductor die through use of heat or pressure, and so on as will occur to readers of skill in the art.

The method of FIG. 3 also includes determining (306) an inductance of a bond wire for the IC in dependence upon electrical characteristics of the IC. The inductance of the bond wire is determined such that the bond wire decreases signal degradation caused by the capacitance of the pad on electrical signals transmitted between the pin and the electrical endpoint of the semiconductor die. In the method of FIG. 3, determining (306) an inductance of a bond wire for the IC may be carried out by determining (312) the inductance in dependence upon the capacitance of the pad, an average frequency of electrical signals to be transmitted between the pin and the electrical endpoint of the semiconductor die, electrical characteristics of the IC package, and electrical characteristics of the pin. Determining (306) an inductance of a bond wire for the IC may also be carried out by iteratively, beginning with a first proposed inductance and ending when a proposed inductance is selected as the inductance for the bond wire: simulating (316) operation of the IC with the bond wire having a proposed inductance to generate an eye diagram; and determining (326) whether a width of an eye of the eye diagram is greater than a predetermined threshold; if the width is not greater than the predetermined threshold, increasing (318) the proposed inductance; and if the width is greater than the predetermined threshold, selecting (320), as the inductance for the bond wire, the proposed inductance. An eye diagram is a diagram generated by measuring, at a receiver connected to a transmitter through an electrical communications channel, the value of a transmitted test bit pattern and superimposing the measured values of two or more clock cycles of the test bit pattern. An eye diagram is so called because, for several types of coding, the diagram looks like one or more eyes between a pair of rails. The opening of the eye has a vertical height and a horizontal width which may be used to derive a number of communication channel performance measurements. Generally, an open eye pattern corresponds to minimal signal distortion along the communications channel, and a closure of an eye pattern corresponds to intersymbol interference and noise in the communications channel. Specifically, as vertical height of the eye opening decreases, the presence of additive noise in the signal increases and as the width of the eye opening decreases the presence of jitter in the signal increases. Simulating (316) operation of the IC to generate such an eye diagram may be carried out by using circuit simulation software, such as a SPICE (Simulation Program with Integrated Circuit Emphasis) application.

The method of FIG. 3 also includes creating (308) the bond wire into an inductor characterized by the determined inductance. In the method of FIG. 3, creating (308) the bond wire into an inductor characterized by the determined inductance may be carried out by adding (322) an inductive metal to a base bond metal of the bond wire or creating (324) a plurality of loops of the bond wire. Adding (322) an inductive metal to a base bond metal of the bond wire may be carried out in various ways such as creating an alloy of the inductive metal and base bond metal, coating the base bond metal with the inductive metal, and in other ways as will occur to readers of skill in the art. Creating (324) a plurality of loops of the bond wire may be carried out by twisting the bond wire around a cylindrical object or in other ways.

The method of FIG. 3 also includes coupling (310) the pad to an IC package pin with the bond wire. Coupling (310) the pad to an IC package pin with the bond wire may be carried out in various was such as soldering, welding, adhering, or the like, one end of the bond wire to IC package components and bonding the bond wire to the pad through ball bonding or wedge bonding as described above.

For further explanation, FIG. 4 sets forth an exemplary method of transmitting an electrical signal in an IC having inductive bond wires in accordance with embodiments of the present invention. The method of FIG. 4 includes transmitting (404) a signal (420) between an electrical endpoint (402) of the IC and an IC package pin (422), the transmitted signal experiencing a reduced amount of signal degradation in the IC. In the example of FIG. 4, the IC includes: a semiconductor die in an IC package, the semiconductor die configured with the electrical endpoint; a pad affixed to the semiconductor die, the pad characterized by a capacitance, the pad coupled to the electrical endpoint; and a bond wire coupling the pad to the IC package pin, the bond wire that is configured as an inductor characterized by an inductance, the inductance configured to decrease degradation of the transmitted signal caused by the capacitance of the pad on electrical signals transmitted between the pin and the electrical endpoint of the semiconductor die.

In the method of FIG. 4, transmitting (404) a signal (420) includes transmitting (406) a signal (420) where the bond wire is configured as an inductive metal added to a base bond metal of the bond wire. Also in the method of FIG. 4, transmitting (404) a signal (420) includes transmitting (408) a signal (420) where the bond wire includes a number of loops of the bond wire. In the method of FIG. 4, transmitting (404) a signal (420) includes transmitting (410) a signal (420) where the inductance of the bond wire is determined in dependence upon the capacitance of the pad, an average frequency of electrical signals to be transmitted between the pin and the electrical endpoint of the semiconductor die, electrical characteristics of the IC package, and electrical characteristics of the pin. Also in the example of FIG. 4, transmitting (404) a signal (420) includes transmitting (412) a signal (420) where the IC is a dual die, DDR3, two DIMMs per channel, quad rank, SDRAM DIMM.

Also in the example of FIG. 4, transmitting (404) a signal (420) includes transmitting (414) a signal (420) where the reduced amount of signal degradation is a reduced amount of signal jitter. Transmitting (404) a signal (420) may also include transmitting (416) a signal (420) where the reduced amount of signal degradation is a reduced amount of signal reflection.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of manufacturing an integrated circuit ('IC'), the method comprising:
    providing a first semiconductor die, the first semiconductor die comprising a first electrical endpoint;
    providing a second semiconductor die, the second semiconductor die comprising a second electrical endpoint;
    affixing to the first semiconductor die a first pad, the first pad characterized by a first capacitance, the first pad coupled to the first electrical endpoint;
    affixing to the second semiconductor die a second pad, the second pad characterized by a second capacitance, the second pad coupled to the second electrical endpoint, wherein the second semiconductor die is stacked on the first semiconductor die, in an IC package;
    determining a first inductance of a first bond wire for the IC in dependence upon electrical characteristics of the IC, the first inductance of the first bond wire configured to decrease signal degradation caused by the capacitance of the first pad on electrical signals transmitted between an IC package pin and the first electrical endpoint of the first semiconductor die;
    determining a second inductance of a second bond wire for the IC in dependence upon electrical characteristics of the IC, the second inductance of the second bond wire configured to decrease signal degradation caused by the capacitance of the second pad on electrical signals transmitted between the IC package pin and the second electrical endpoint of the second semiconductor die, wherein the first inductance of the first bond wire is different from the second inductance of the second bond wire;
    creating the first bond wire into a first inductor characterized by the determined first inductance;
    creating the second bond wire into a second inductor characterized by the determined second inductance;
    coupling the first pad to the IC package pin with the first bond wire; and
    coupling the second pad to the IC package pin with the second bond wire,
    wherein the first inductance of the first bond wire and the second inductance of the second bond wire are determined from the entire group consisting of the capacitance of the pads, an average frequency of electrical signals to be transmitted between the IC package pin and the electrical endpoints of the semiconductor dies, electrical characteristics of the IC package, and electrical characteristics of the IC package pin.

2. The method of claim 1 wherein creating the first bond wire further comprises adding an inductive metal to a base bond metal of the first bond wire.

3. The method of claim 1 wherein creating the first bond wire further comprises creating a plurality of loops of the first bond wire.

4. The method of claim 1 wherein determining the first inductance of the first bond wire for the integrated circuit in dependence upon electrical characteristics of the IC further comprises:
    iteratively, beginning with a first proposed inductance and ending when a proposed inductance is selected as the first inductance for the first bond wire:
        simulating operation of the IC with the first bond wire having a proposed inductance to generate an eye diagram;
        determining whether a width of an eye of the eye diagram is greater than a predetermined threshold;
        if the width is not greater than the predetermined threshold, increasing the proposed inductance; and
        if the width is greater than the predetermined threshold, selecting, as the first inductance for the first bond wire, the proposed inductance.

5. The method of claim 1 wherein the integrated circuit is for implementing a dual die, Double Data Rate Three ('DDR3'), two Dual Inline Memory Modules ('DIMMs')

per channel, quad rank, Synchronous Dynamic Random Access Memory ('SDRAM') DIMM.

* * * * *